United States Patent
Nagano

(10) Patent No.: US 9,558,936 B2
(45) Date of Patent: Jan. 31, 2017

(54) SEMICONDUCTOR MANUFACTURING APPARATUS AND SEMICONDUCTOR MANUFACTURING METHOD

(71) Applicant: Kabushiki Kaisha Toshiba, Minato-ku (JP)

(72) Inventor: Hajime Nagano, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/832,040

(22) Filed: Aug. 21, 2015

(65) Prior Publication Data

US 2016/0284533 A1 Sep. 29, 2016

(30) Foreign Application Priority Data

Mar. 25, 2015 (JP) ................................. 2015-062657

(51) Int. Cl.
*H01L 21/469* (2006.01)
*H01L 21/02* (2006.01)
*C23C 16/455* (2006.01)

(52) U.S. Cl.
CPC ..... *H01L 21/0228* (2013.01); *C23C 16/45527* (2013.01); *C23C 16/45544* (2013.01); *H01L 21/0217* (2013.01)

(58) Field of Classification Search
CPC .......................... C23C 16/455; H01L 21/67011
See application file for complete search history.

(56) References Cited

U.S. PATENT DOCUMENTS

| 8,216,648 | B2 | 7/2012 | Matsunaga et al. |
| 8,808,455 | B2 | 8/2014 | Saito et al. |
| 2006/0099348 | A1 | 5/2006 | Narushima et al. |
| 2011/0186984 | A1* | 8/2011 | Saito ................ H01L 21/02186 257/734 |
| 2011/0203524 | A1 | 8/2011 | Uno |
| 2011/0256041 | A1* | 10/2011 | Ho ...................... C23C 16/4402 423/210 |

FOREIGN PATENT DOCUMENTS

| JP | 2006-120714 | 5/2006 |
| JP | 2011-60842 | 3/2011 |
| JP | 2011-171566 | 9/2011 |
| JP | 5575299 | 8/2014 |
| JP | 5610438 | 10/2014 |

* cited by examiner

*Primary Examiner* — Zandra Smith
*Assistant Examiner* — Evan Clinton
(74) *Attorney, Agent, or Firm* — Oblon, McClelland, Maier & Neustadt, L.L.P.

(57) ABSTRACT

In one embodiment, a semiconductor manufacturing apparatus includes an accommodation module configured to accommodate a substrate. The apparatus further includes a first flow channel including first openings configured to emit a first gas into the accommodation module. The apparatus further includes a second flow channel including second openings configured to emit the first gas into the accommodation module, a number or a size of the second openings being different from a number or a size of the first openings. The apparatus further includes a controller configured to control supplying of the first gas to the first and second flow channels such that the first gas is emitted from the first openings at a first flow velocity and the first gas is emitted from the second openings at a second flow velocity different from the first flow velocity.

18 Claims, 16 Drawing Sheets

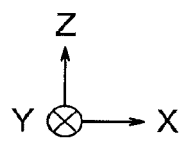 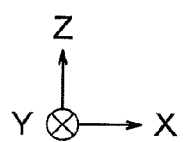 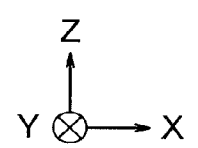
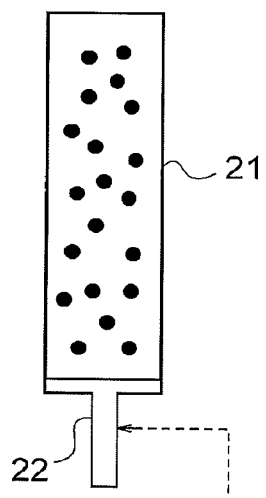 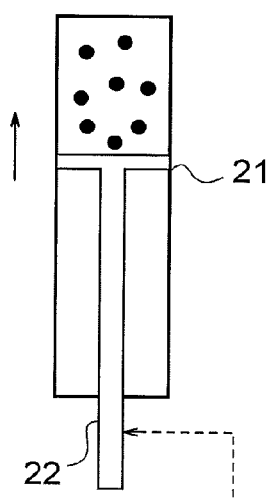 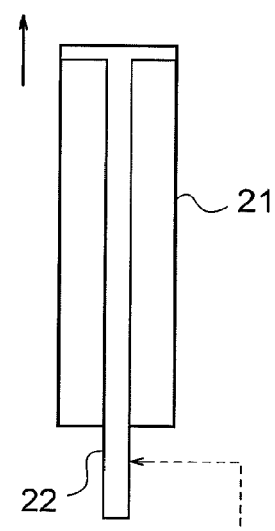
FIG. 5A     FIG. 5B     FIG. 5C

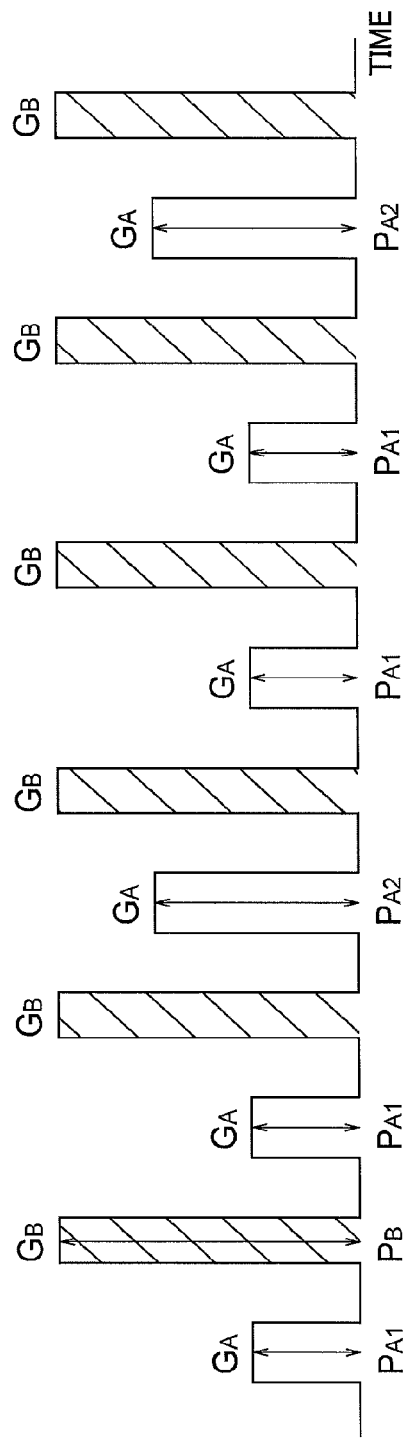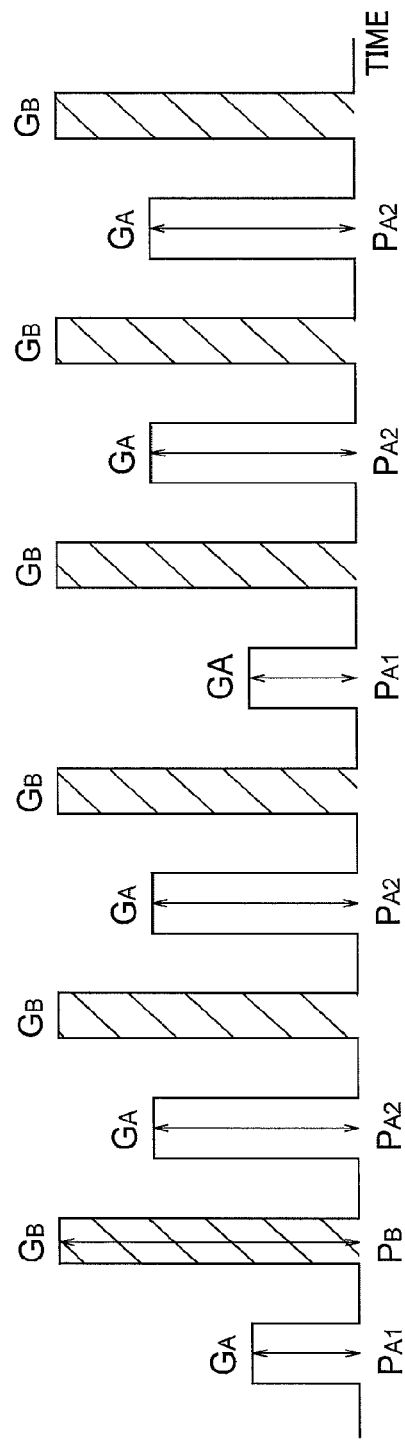

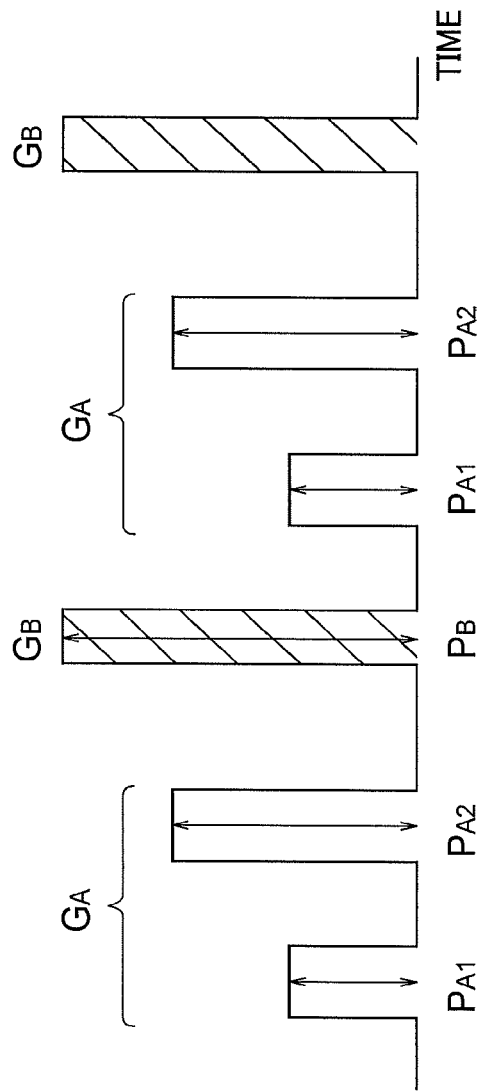
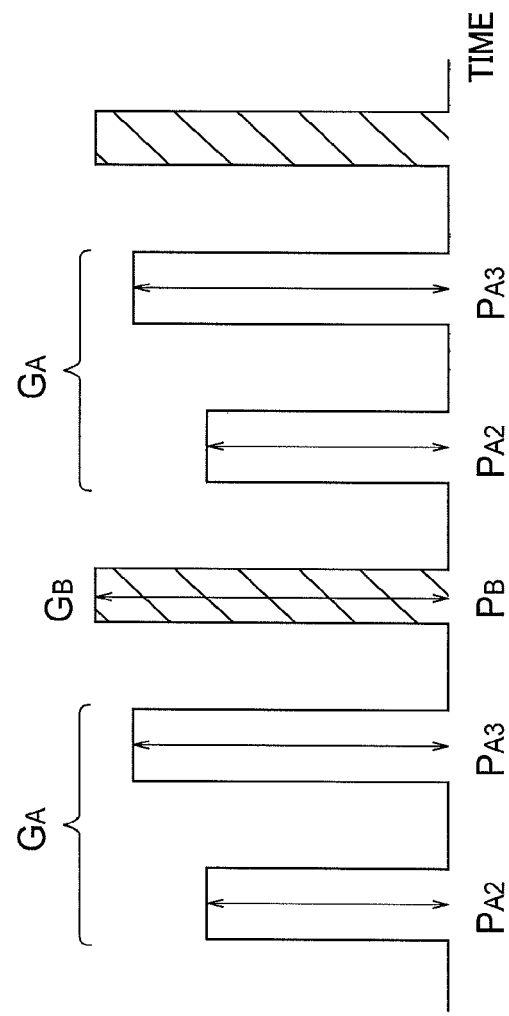
FIG. 13A
FIG. 13B

SEMICONDUCTOR MANUFACTURING APPARATUS AND SEMICONDUCTOR MANUFACTURING METHOD

CROSS REFERENCE TO RELATED APPLICATION

This application is based upon and claims the benefit of priority from the prior Japanese Patent Application No. 2015-62657, filed on Mar. 25, 2015, the entire contents of which are incorporated herein by reference.

FIELD

Embodiments described herein relate to a semiconductor manufacturing apparatus and a semiconductor manufacturing method.

BACKGROUND

Atomic layer deposition (ALD) is a film forming method having an excellent property for controlling a thickness of a thin film. However, when the ALD is applied to a batch-type film forming apparatus that simultaneously forms films on plural wafers, an amount of a source gas arriving at a center portion of a wafer becomes smaller than an amount of the source gas arriving at a circumferential portion of the wafer if a surface area of a base layer, which is a film forming target on the wafer, becomes larger. As a result, the thickness of the film on each wafer becomes different in the circumferential portion and the center portion, so that in-plane uniformity of the thickness of the film is deteriorated. However, if a gas supply amount or a wafer interval is simply adjusted to improve the in-plane uniformity of the thickness of the film, quality of the film may be deteriorated and a film forming process may be complicated.

BRIEF DESCRIPTION OF THE DRAWINGS

FIGS. 5A to 5C are schematic diagrams illustrating a first example of a gas feeder of the semiconductor manufacturing apparatus of the first embodiment;

FIGS. 11A and 11B are graphs illustrating an example of gas supply timing in the semiconductor manufacturing method of the comparative example of the first embodiment;

FIGS. 13A and 13B are graphs illustrating an example of gas supply timing in the semiconductor manufacturing method of the first embodiment;

DETAILED DESCRIPTION

Embodiments will now be explained with reference to the accompanying drawings.

In one embodiment, a semiconductor manufacturing apparatus includes an accommodation module configured to accommodate a substrate. The apparatus further includes a first flow channel including first openings configured to emit a first gas into the accommodation module. The apparatus further includes a second flow channel including second openings configured to emit the first gas into the accommodation module, a number or a size of the second openings being different from a number or a size of the first openings. The apparatus further includes a controller configured to control supplying of the first gas to the first and second flow channels such that the first gas is emitted from the first openings at a first flow velocity and the first gas is emitted from the second openings at a second flow velocity different from the first flow velocity.

(First Embodiment)

Figure 1:
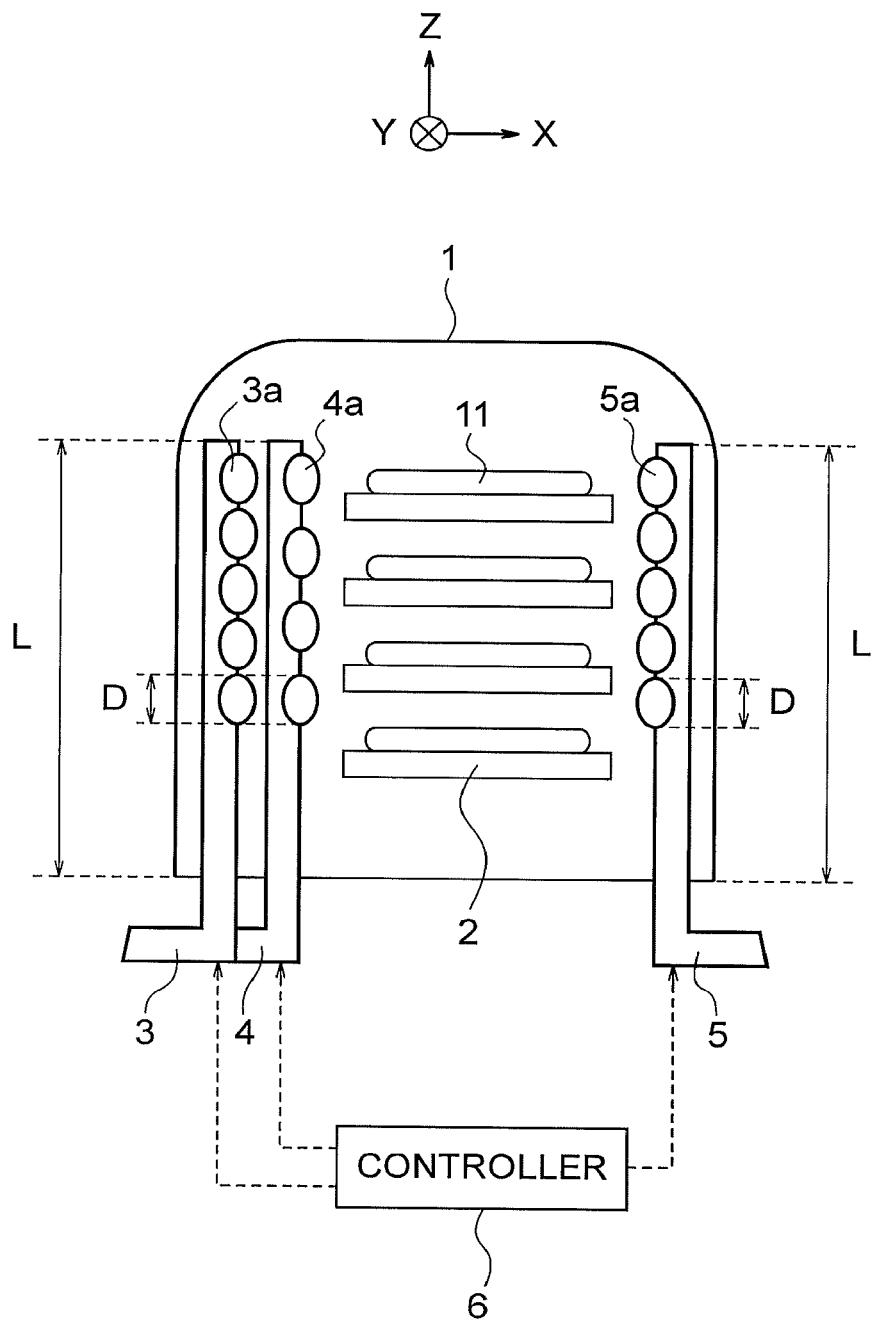
FIG. 1 is a sectional view illustrating a structure of a semiconductor manufacturing apparatus of a first embodiment.

FIG. 1 is a sectional view illustrating a structure of a semiconductor manufacturing apparatus of a first embodiment.

The semiconductor manufacturing apparatus of FIG. 1 includes a glass tube 1 as an example of an accommodation module, wafer arrangement modules 2, a first injector 3 as an example of a first flow channel, a second injector 4 as an example of a second flow channel, an injector 5 as an example of a flow channel, and a controller 6. The semiconductor manufacturing apparatus of FIG. 1 is a batch-type ALD apparatus that simultaneously forms films on plural wafers 11. The wafers 11 are an example of a substrate of the disclosure.

The glass tube 1 can accommodate the plural wafers 11. The wafer arrangement modules 2 are used to arrange the wafers 11 accommodated in the glass tube 1. Each wafer 11 of the present embodiment is arranged on a wafer arrangement module 2 in a state that a front surface is toward an upward side and a back surface is toward a downward side. For example, each wafer 11 includes a semiconductor substrate and a process target layer formed on the semiconductor substrate. The front surface of each wafer 11 (a surface of the process target layer) may be flat or may be uneven.

FIG. 1 illustrates X and Y directions parallel to the front and back surfaces of the wafer 11 and perpendicular to each other and a Z direction perpendicular to the front and back surfaces of the wafer 11. In the specification, a +Z direction is handled as an upward direction and a −Z direction is handled as a downward direction. For example, when a wafer 11 is arranged in a wafer arrangement module 2, a positional relation between the wafer arrangement module 2 and the wafer 11 is expressed that the wafer arrangement module 2 is located below the wafer 11. In the present embodiment, the −Z direction may be matched with a gravity direction and may not be matched with the gravity direction.

The first injector 3, the second injector 4 and the injector 5 are arranged in the glass tube 1 and emit a source gas to form the films on the wafers 11. The semiconductor manufacturing apparatus of the present embodiment is used to form silicon nitride (SiN) films on the wafers 11. The first and second injectors 3 and 4 emit a $SiH_2Cl_2$ gas as a source gas of silicon into the glass tube 1. The injector 5 emits a $NH_3$ gas as a source gas of nitrogen into the glass tube 1. Here, H shows hydrogen and Cl shows chlorine. The silicon nitride films are formed by a reaction of the $SiH_2Cl_2$ gas and the $NH_3$ gas. The $SiH_2Cl_2$ gas is an example of a first gas, and the $NH_3$ gas is an example of a second gas.

A symbol L shows the length of the first injector 3, the second injector 4 and the injector 5 in the glass tube 1. In this manner, these injectors 3 to 5 have the same length L in the glass tube 1. These injectors 3 to 5 extend in the Z direction in the glass tube 1.

The first injector 3 has first openings 3a to emit the first gas ($SiH_2Cl_2$ gas) into the glass tube 1, and the second injector 4 has second openings 4a to emit the first gas ($SiH_2Cl_2$ gas) into the glass tube 1. A symbol D shows the diameter of the first and second openings 3a and 4a. In this manner, the first and second openings 3a and 4a have the same diameter D and therefore have the same size. However, the number of first openings 3a of the first injector 3 is five whereas the number of second openings 4a of the second injector 4 is four, so that these numbers are different from each other.

The injector 5 has openings 5a to emit the second gas ($NH_3$ gas) into the glass tube 1. The openings 5a have the same diameter (size) as the diameter of the first and second openings 3a and 4a. However, the openings 5a may have a diameter (size) different from the diameter of the first and second openings 3a and 4a. In addition, the number of openings 5a of the injector 5 of the present embodiment is five. However, this number may not be five.

The controller 6 controls various operations of the semiconductor manufacturing apparatus. For example, the controller 6 controls supplying of the first gas to the first and second injectors 3 and 4 and supplying of the second gas to the injector 5. The controller 6 of the present embodiment can control supplying of the first and second gases by controlling an operation of an apparatus that supplies a gas to the injectors 3 to 5 and opening/closing of valves on flow channels that supply the gas to the injectors 3 to 5.

An opening area of the first injector 3 is represented by a total sum of areas of the first openings 3a provided on the first injector 3. A first flow velocity of the first gas emitted from the first openings 3a depends on the opening area of the first injector 3. Similarly, an opening area of the second injector 4 is represented by a total sum of areas of the second openings 4a provided on the second injector 4. A second flow velocity of the first gas emitted from the second openings 4a depends on the opening area of the second injector 4.

In the present embodiment, because the number of first openings 3a and the number of second openings 4a are different from each other, the opening area of the first injector 3 and the opening area of the second injector 4 are different from each other. Therefore, the controller 6 of the present embodiment can set the first flow velocity and the second flow velocity to different values easily. For example, the controller 6 can set the second flow velocity to a value more than the first flow velocity by supplying the first gas to the first and second injectors 3 and 4 at the same flow rate.

According to experiments, an amount of gas arriving at a center portion of each wafer 11 can be increased by increasing the flow velocity of the gas. The flow velocity of the gas generally increases when an opening area of an injector emitting the gas decreases. Therefore, the controller 6 can increase an amount of first gas arriving at the center portion by supplying the first gas from the second openings 4a at the second flow velocity, instead of supplying the first gas from the first openings 3a at the first flow velocity. As a result, even when a surface area of each wafer 11 is large, a silicon nitride film having superior in-plane uniformity of the thickness can be formed.

Figure 2:
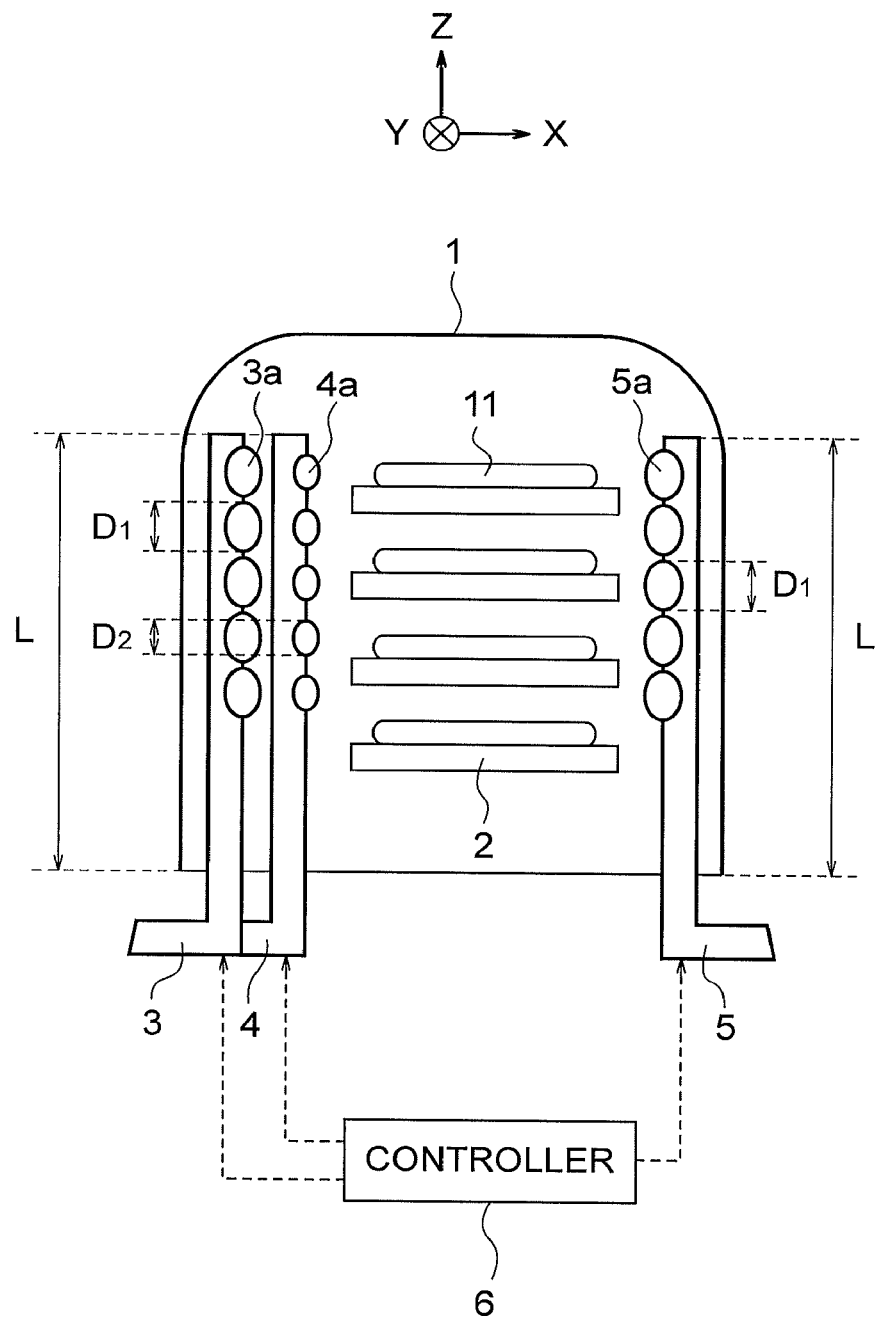
FIG. 2 is a sectional view illustrating a structure of a semiconductor manufacturing apparatus of a first modification of the first embodiment.

FIG. 2 is a sectional view illustrating a structure of a semiconductor manufacturing apparatus of a first modification of the first embodiment.

In FIG. 2, the number of second openings 4a of the second injector 4 is equal to the number of first openings 3a of the first injector 3. However, the diameter $D_2$ of the second openings 4a is smaller than the diameter $D_1$ of the first openings 3a and therefore the size of the second openings 4a is smaller than the size of the first openings 3a. For this reason, in FIG. 2, an opening area of the first injector 3 and an opening area of the second injector 4 are different from each other. Therefore, the flow velocity control by the controller 6 of FIG. 1 can also be realized in this modification.

Figure 3:
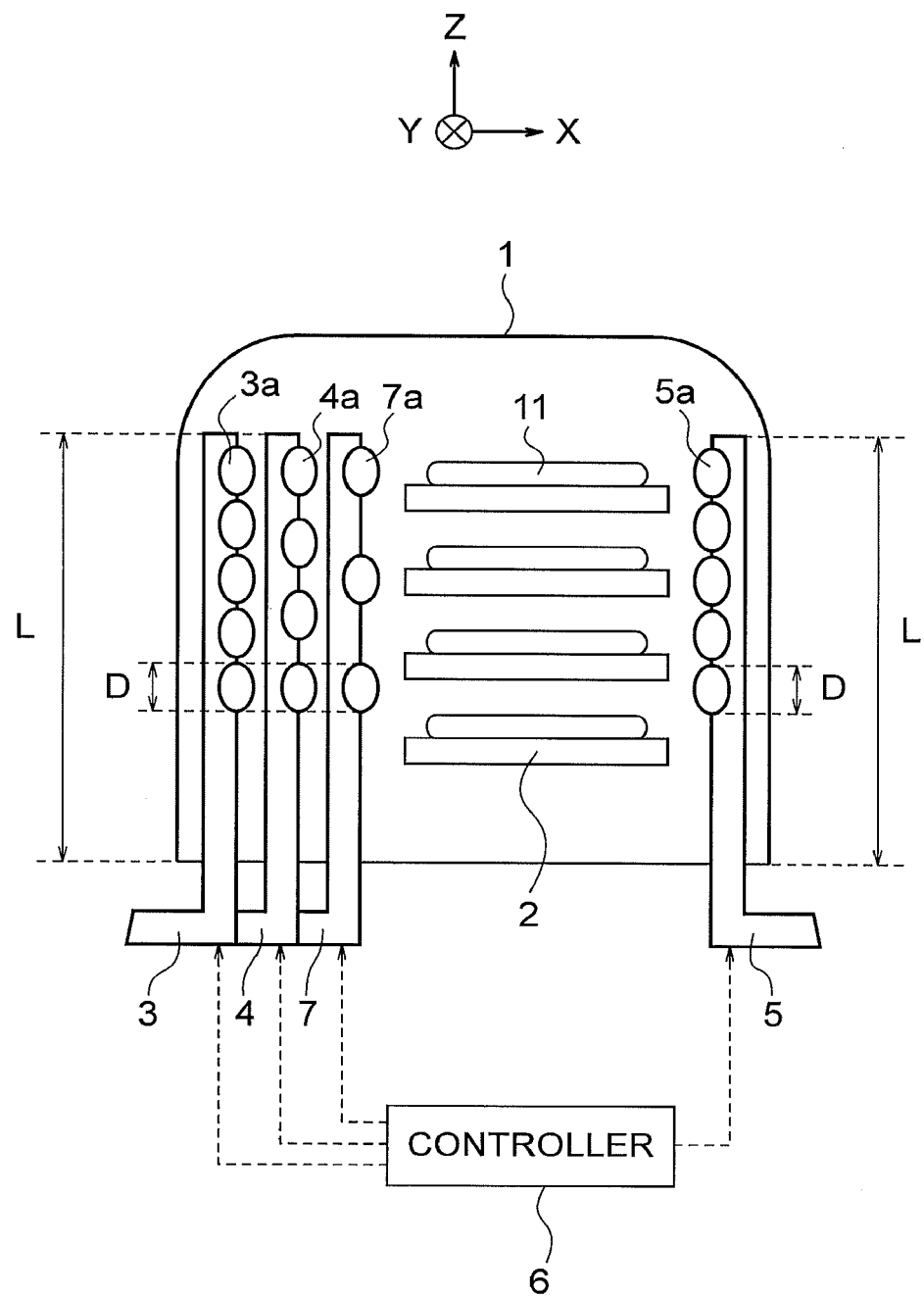
FIG. 3 is a sectional view illustrating a structure of a semiconductor manufacturing apparatus of a second modification of the first embodiment.

FIG. 3 is a sectional view illustrating a structure of a semiconductor manufacturing apparatus of a second modification of the first embodiment.

The semiconductor manufacturing apparatus of FIG. 3 includes a third injector 7 as an example of a third flow channel, in addition to the components illustrated in FIG. 1. The third injector 7 has third openings 7a to emit the first gas ($SiH_2Cl_2$ gas) into the glass tube 1. The first to third injectors 3, 4 and 7 have the same length L in the glass tube 1. The first to third openings 3a, 4a and 7a have the same diameter D and therefore have the same size. However, the numbers of first to third openings 3a, 4a and 7a of the first to third injectors 3, 4 and 7 are five, four and three, respectively, so that these numbers are different from each other.

The first flow velocity of the first gas emitted from the first openings 3a depends on an opening area of the first injector 3. The second flow velocity of the first gas emitted from the second openings 4a depends on an opening area of the second injector 4. The third flow velocity of the first gas emitted from the third openings 7a depends on an opening area of the third injector 7.

Therefore, the controller 6 of the present embodiment can set the first, second and third flow velocities to different values easily. For example, the controller 6 can set the second flow velocity to a value more than the first flow velocity and set the third flow velocity to a value more than the second flow velocity by supplying the first gas to the first to third injectors 3, 4 and 7 at the same flow rate. According to this modification, in-plane uniformity of the thickness of the silicon nitride film can be improved.

Figure 4:
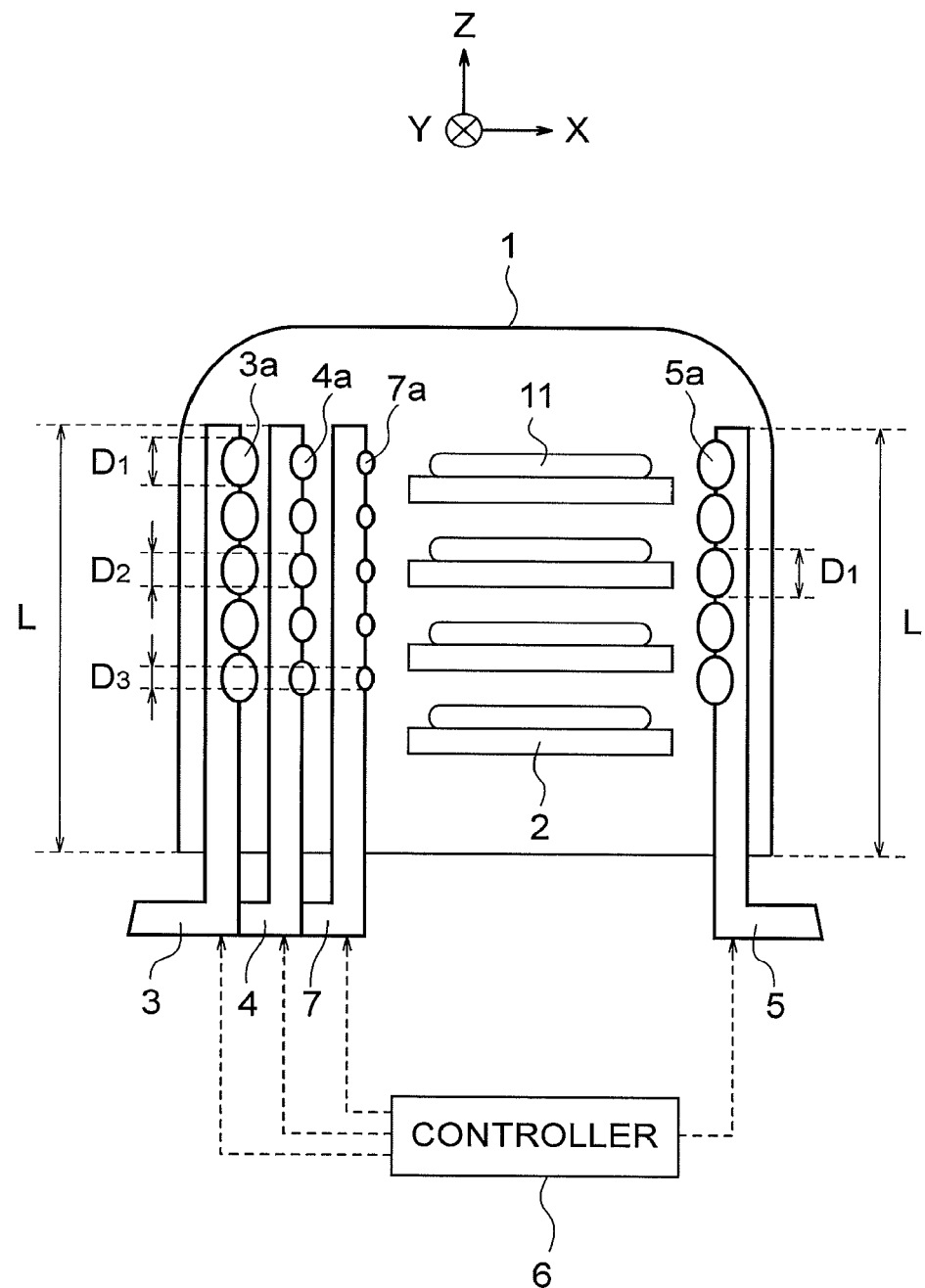
FIG. 4 is a sectional view illustrating a structure of a semiconductor manufacturing apparatus of a third modification of the first embodiment.

FIG. 4 is a sectional view illustrating a structure of a semiconductor manufacturing apparatus of a third modification of the first embodiment.

In FIG. 4, the number of second openings 4a and the number of third openings 7a are equal to the number of first openings 3a. However, the diameter $D_2$ of the second openings 4a is smaller than the diameter $D_1$ of the first openings 3a and therefore the size of the second openings 4a is smaller than the size of the first openings 3a. In addition, the diameter $D_3$ of the third openings 7a is smaller than the diameter $D_2$ of the second openings 4a and therefore the size of the third openings 7a is smaller than the size of the second openings 4a. For this reason, in FIG. 4, the opening areas of the first to third injectors 3, 4 and 7 are different from each other. Therefore, the flow velocity control by the controller 6 of FIG. 3 can also be realized in this modification.

The number of injectors to supply the first gas to the semiconductor manufacturing apparatus of the present embodiment may be four or more. In addition, the second openings 4a of the second injector 4 and the first openings 3a of the first injector 3 may be different from each other in both the numbers and the sizes thereof. Similarly, the third openings 7a of the third injector 7 and the first and second openings 3a and 4a of the first and second injectors 3 and 4 may be different from each other in both the numbers and the sizes thereof. This is also applicable to the four or more injectors described above. In other words, openings of these injectors may be different from each other in one of the numbers and the sizes thereof and may be different from each other in both the numbers and the sizes thereof.

(1) Gas Feeder of First Embodiment

Next, a gas feeder that supplies the first gas to the first and second injectors 3 and 4 of the semiconductor manufacturing apparatus of FIG. 1 or 2 will be described. The gas feeder can also supply the first gas to the first to third injectors 3, 4 and 7 of the semiconductor manufacturing apparatus of FIG. 3 or 4.

FIGS. 5A to 5C are schematic diagrams illustrating a first example of the gas feeder of the semiconductor manufacturing apparatus of the first embodiment.

The gas feeder of FIG. 5A includes a cylinder 21 as an example of a storage module, and a piston 22 as an example of an adjustment module.

The cylinder 21 is used to store the first gas. The cylinder 21 is connected to the first and second injectors 3 and 4. The controller 6 selects any one of the injectors 3 and 4 and supplies the first gas in the cylinder 21 to the selected injector. The first gas is supplied into the glass tube 1 through the selected injector.

The piston 22 can adjust a ratio of an amount of the first gas discharged from the cylinder 21 to the glass tube 1 and an amount of the first gas left in the cylinder 21. For example, if a position of the piston 22 changes from FIG. 5A to FIG. 5B, the first gas of about 60% is discharged and the first gas of about 40% is left. In addition, if the position of the piston 22 changes from FIG. 5B to FIG. 5C, the left first gas of about 40% is also discharged.

The controller 6 supplies the first gas to the second injector 4 immediately after supplying the first gas to the first injector 3, for example. If the gas feeder of this example is used, such control can be realized easily. Specifically, the controller 6 selects the first injector 3 and changes the position of the piston 22 from FIG. 5A to FIG. 5B. Next, the controller 6 selects the second injector 4 and changes the position of the piston 22 from FIG. 5B to FIG. 5C. Thereby, the first gas of about 60% can be discharged from the first openings 3a at the first flow velocity and the first gas of about 40% can be discharged from the second openings 4a at the second flow velocity.

Figures 6A, 6B, 6C:
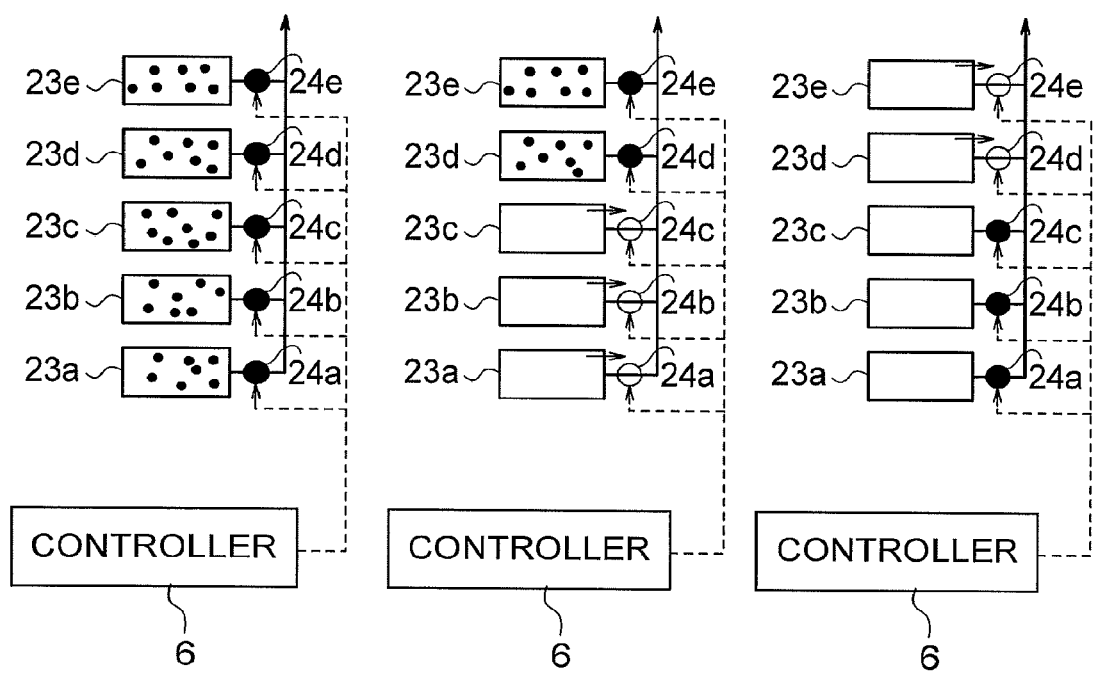
FIGS. 6A to 6C are schematic diagrams illustrating a second example of the gas feeder of the semiconductor manufacturing apparatus of the first embodiment.

FIGS. 6A to 6C are schematic diagrams illustrating a second example of the gas feeder of the semiconductor manufacturing apparatus of the first embodiment.

The gas feeder of FIG. 6A includes first to fifth buffer tanks 23a to 23e as an example of first to N-th storage modules, and first to fifth valves 24a to 24e as an example of first to N-th valves, where N is an integer of two or more. A value of N may not be five.

The first to fifth buffer tanks 23a to 23e are used to store the first gas. The first to fifth buffer tanks 23a to 23e are connected to the first and second injectors 3 and 4. The controller 6 selects any one of the injectors 3 and 4 and supplies the first gas in the first to fifth buffer tanks 23a to 23e. The first gas is supplied into the glass tube 1 through the selected injector.

The first to fifth valves 24a to 24e are provided on flow channels between the first to fifth buffer tanks 23a to 23e and the glass tube 1, respectively. For example, if the first to third valves 24a to 24c are opened, the first gas in the first to third buffer tanks 23a to 23c is discharged to the glass tube 1 (refer to FIG. 6B). Then, if the fourth and fifth valves 24d and 24e are opened, the first gas in the fourth and fifth buffer tanks 23d and 23e is discharged to the glass tube 1 (refer to FIG. 6C).

The controller 6 supplies the first gas to the second injector 4 immediately after supplying the first gas to the first injector 3, for example. If the gas feeder of this example is used, such control can be realized easily. Specifically, the controller 6 selects the first injector 3 and changes states of the first to fifth valves 24a to 24e from FIG. 6A to FIG. 6B. Next, the controller 6 selects the second injector 4 and changes the states of the first to fifth valves 24a to 24e from FIG. 6B to FIG. 6C. Thereby, the first gas of about 60% can be discharged from the first openings 3a at the first flow velocity and the first gas of about 40% can be discharged from the second openings 4a at the second flow velocity.

Figure 7:
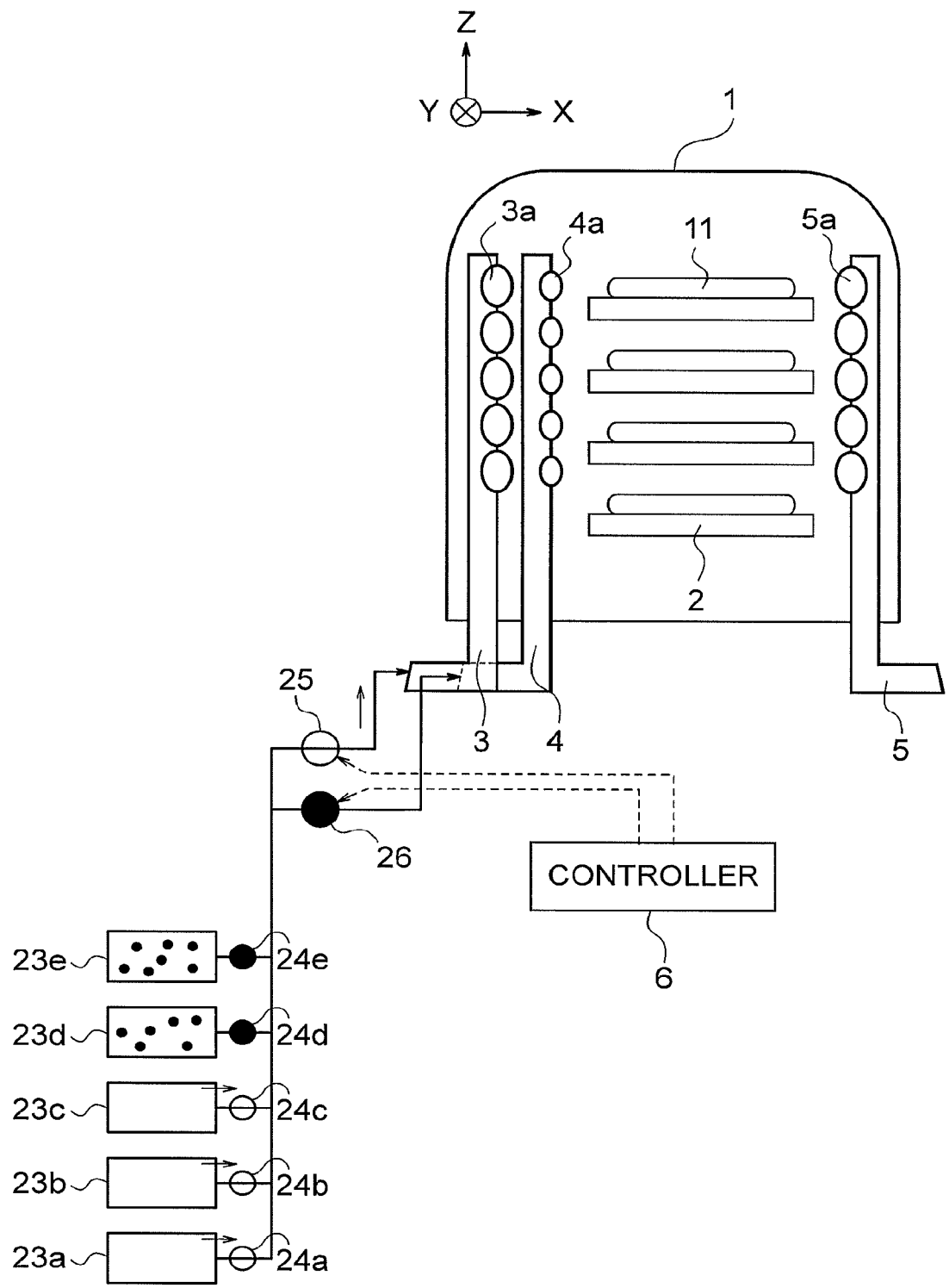
FIG. 7 is a schematic diagram illustrating an operation of the gas feeder of FIGS. 6A to 6C.
Figure 8:
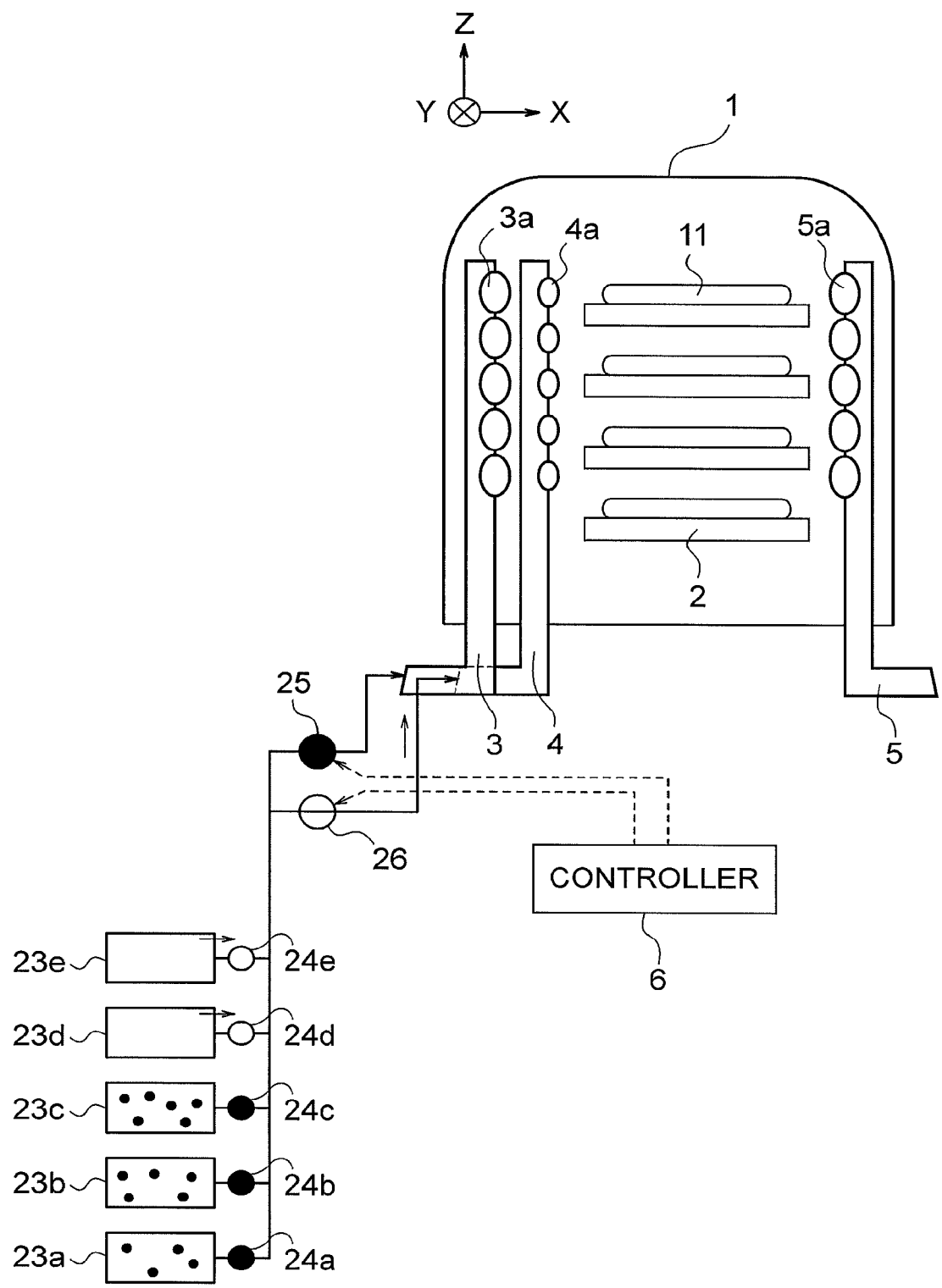
FIG. 8 is a schematic diagram illustrating the operation of the gas feeder of FIGS. 6A to 6C.

FIGS. 7 and 8 are schematic diagrams illustrating an operation of the gas feeder of FIGS. 6A to 6C. FIG. 7 illustrates a state in which the first gas is supplied to the first injector 3. FIG. 8 illustrates a state in which the first gas is supplied to the second injector 4.

The first to fifth buffer tanks 23a to 23e are connected to five flow channels provided with the first to fifth valves 24a to 24e, as illustrated in FIGS. 7 and 8. The five flow channels join with one flow channel and the one flow channel is branched into two flow channels. One of the two flow channels is connected to the first injector 3 via a valve 25 and the other is connected to the second injector 4 via a valve 26.

When the controller 6 selects the first injector 3, the controller 6 opens the valve 25 and closes the valve 26 (refer to FIG. 7). As a result, the first gas is supplied to only the first injector 3. When the controller 6 selects the second injector 4, the controller 6 closes the valve 25 and opens the valve 26 (refer to FIG. 8). As a result, the first gas is supplied to only the second injector 4. Configurations and control of the valves 25 and 26 are also applicable to the gas feeder of FIGS. 5A to 5C.

(2) Comparative Example of First Embodiment

Figure 9A:
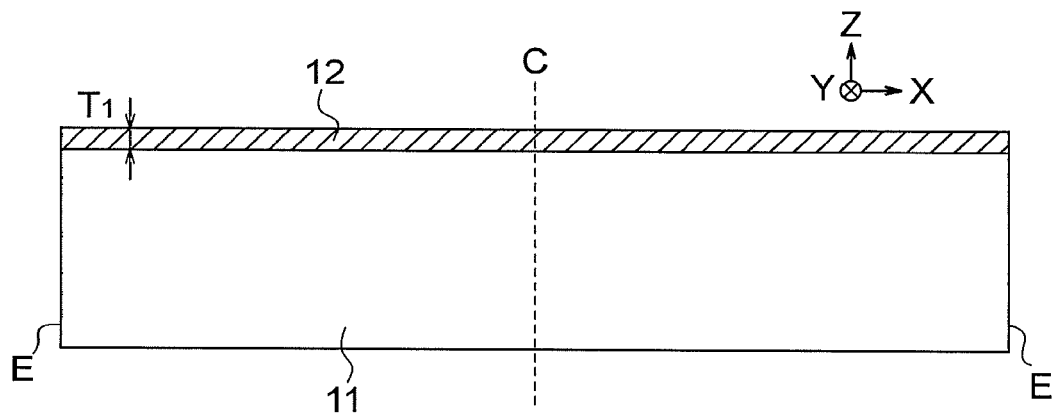
FIGS. 9A to 9C are sectional views illustrating a semiconductor manufacturing method of a comparative example of the first embodiment.
Figure 9B:
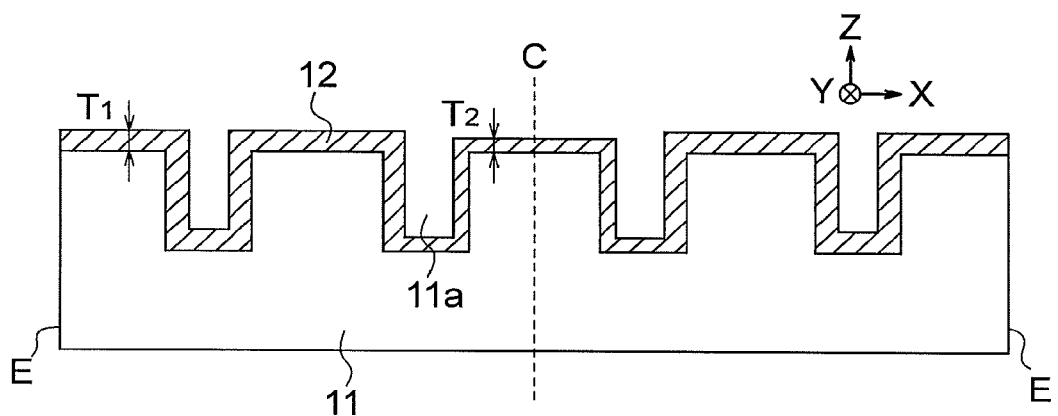
Figure 9C:
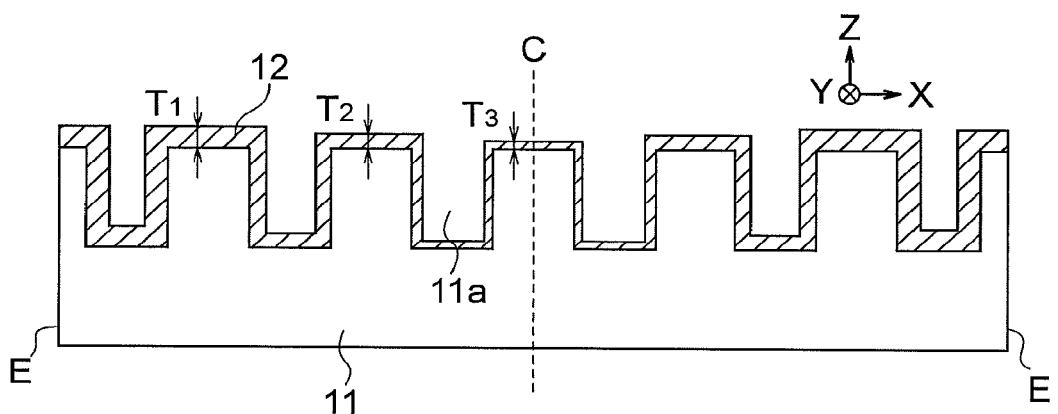

FIGS. 9A to 9C are sectional views illustrating a semiconductor manufacturing method of a comparative example of the first embodiment.

FIG. 9A illustrates a wafer 11 having a flat surface and a small surface area. FIG. 9B illustrates a wafer 11 having a surface including recesses 11a and a large surface area. FIG. 9C illustrates a wafer 11 having a surface including multiple recesses 11a and a larger surface area. A symbol C shows a center of each wafer 11. A symbol E shows an end of each wafer 11.

In this comparative example, a film 12 is formed on the surface of each wafer 11 of FIGS. 9A to 9C by a batch-type ALD apparatus. The film 12 is a silicon nitride film, for example. However, the flow velocity of the first gas is set to the same value in FIGS. 9A to 9C.

In this case, the thickness of the film 12 of FIG. 9A is uniform. A symbol $T_1$ shows the thickness of the film 12 of FIG. 9A. However, the thickness of the film 12 of FIG. 9B is different in a circumferential portion and a center portion of the wafer. Specifically, the thickness is $T_1$ in the circumferential portion and the thickness is $T_2$ ($<T_1$) in the center portion. This is because an amount of the first gas arriving at the center portion is smaller than an amount of the first gas arriving at the circumferential portion. This phenomenon becomes notable in FIG. 9C. In FIG. 9C, the thickness at the center portion of the wafer becomes $T_3$ ($<T_2$).

Figure 10A:
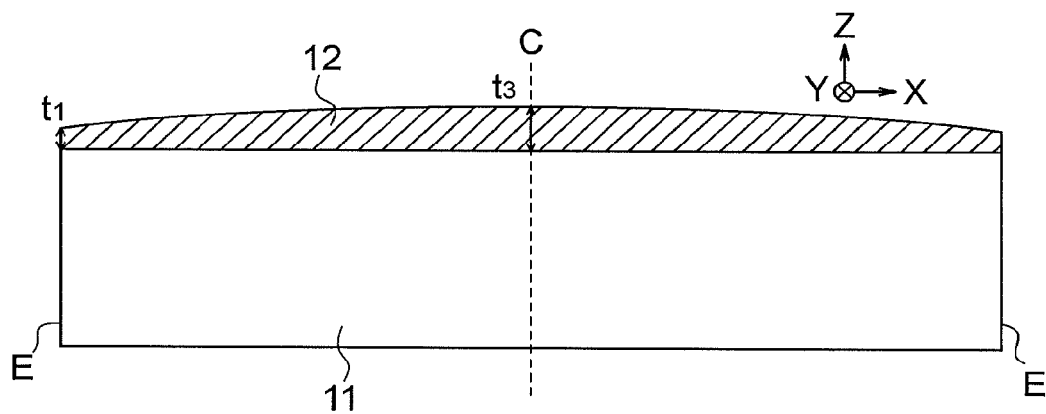
FIGS. 10A to 10C are sectional views illustrating a semiconductor manufacturing method of the comparative example of the first embodiment.
Figure 10B:
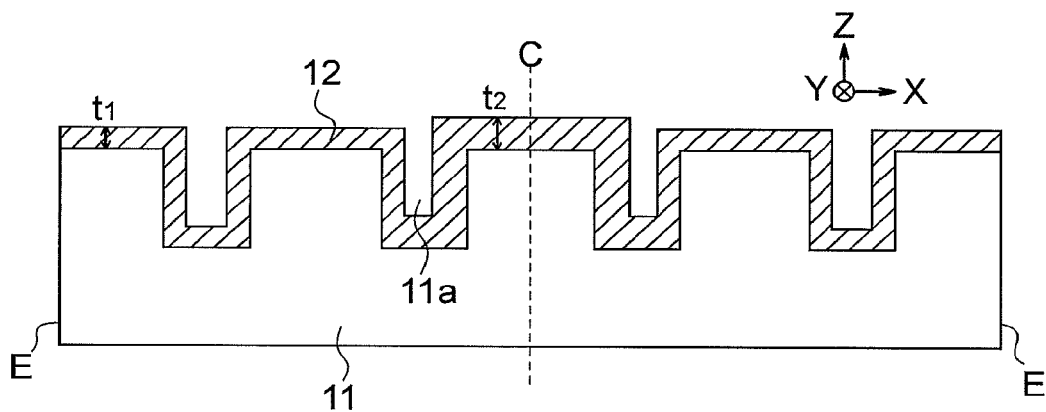
Figure 10C:
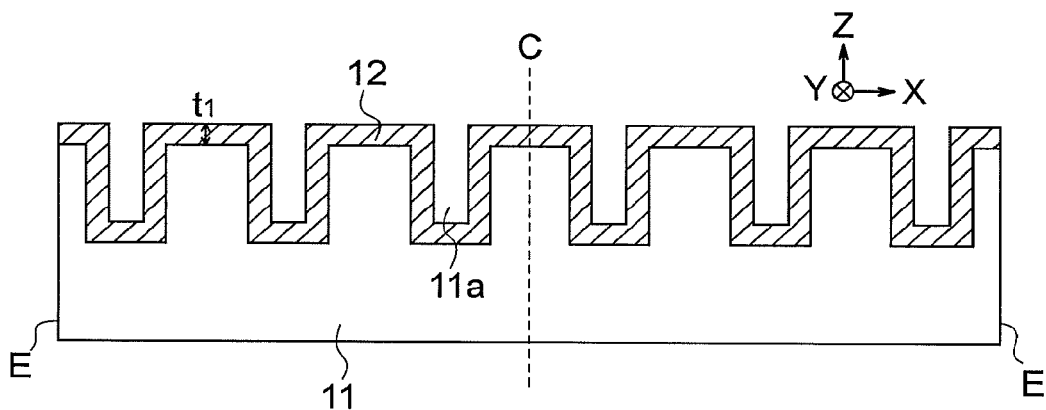

FIGS. 10A to 10C are sectional views illustrating a semiconductor manufacturing method of the comparative example of the first embodiment.

Wafers 11 of FIGS. 10A to 10C have a small surface area, a large surface area, and a larger surface area, respectively, similar to the wafers 11 of FIGS. 9A to 9C. However, in FIGS. 10A to 10C, a supply amount of the first gas per unit time is set to the double of the supply amount in the FIGS. 9A to 9C.

In this case, because the first gas of a sufficient amount arrives at the center portion of the wafer of FIG. 10C, the thickness of the film 12 of FIG. 10C becomes uniform. A symbol $t_1$ shows the thickness of the film 12 of FIG. 10C. However, the first gas of an excessive amount arrives at the center portion of the wafer of FIG. 10B. For this reason, the thickness and the quality of the film 12 may be different in the circumferential portion of the wafer and the center portion. A symbol $t_2$ shows the thickness at the center portion of the wafer of FIG. 10B ($t_2>t_1$). This phenomenon becomes notable in FIG. 10A. A symbol $t_3$ shows the thickness at the center portion of the wafer of FIG. 10A ($t_3>t_2$).

FIGS. 11A and 11B are graphs illustrating an example of gas supply timing in a semiconductor manufacturing method of the comparative example of the first embodiment.

In this semiconductor manufacturing method, instead of the first and second injectors 3 and 4 of FIGS. 1 to 4, two injectors having openings of the same number and size are used to supply the first gas. Meanwhile, the same injector as the injector 5 of FIGS. 1 to 4 is used to supply the second gas.

FIG. 11A illustrates supply timings of the first and second gases when a film 12 is formed on a wafer 11 having a small surface area. FIG. 11B illustrates supply timings of the first and second gases when a film 12 is formed on a wafer 11 having a large surface area. A symbol $G_A$ shows the supply timing of the first gas. A symbol $G_B$ shows the supply timing of the second gas. As illustrated in FIGS. 11A and 11B, the first gas and the second gas are alternately supplied repetitively.

In this semiconductor manufacturing method, the supply amount of the second gas per one time takes a constant value $P_B$. Meanwhile, the supply amount of the first gas per one time takes a first value $P_{A1}$ and a second value $P_{A2}$. The first value $P_{A1}$ is a supply amount when the first gas is emitted from one injector. The second value $P_{A2}$ is a supply amount when the first gas is emitted from two injectors.

As illustrated in FIG. 11A, when the film 12 is formed on the wafer 11 having the small surface area, the number of times of supply of the first gas from only one injector is large. As illustrated in FIG. 11B, when the film 12 is formed on the wafer 11 having the large surface area, the number of times of supply of the first gas from the two injectors is large.

In this manner, when the surface area of the wafer 11 increases, the supply amount of the first gas per unit time increases in this semiconductor manufacturing method. This means that a process of FIG. 9A is adopted when the surface area of the wafer 11 is small and a process of FIG. 10B (or FIG. 10C) is adopted when the surface area of the wafer 11 is large. However, it is difficult in this case to secure uniformity of the thickness and the quality of the film 12, as described above.

Figure 12A:
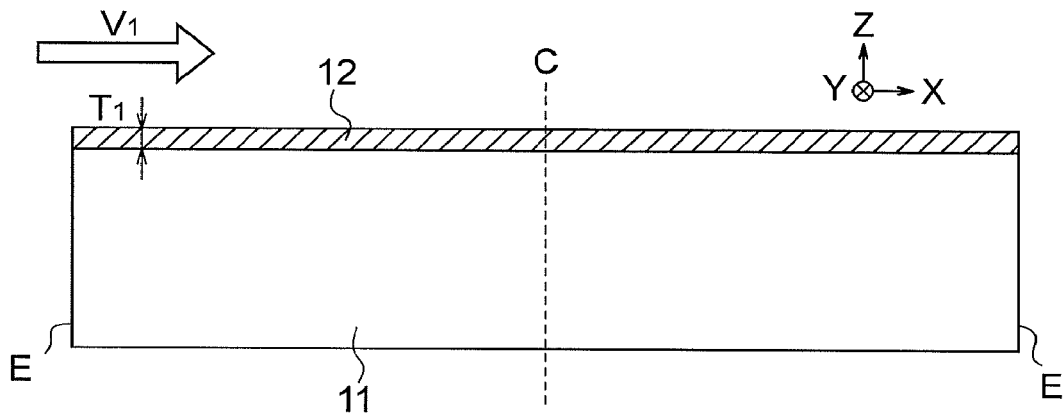
FIGS. 12A to 12C are sectional views illustrating the semiconductor manufacturing method of the first embodiment.
Figure 12B:
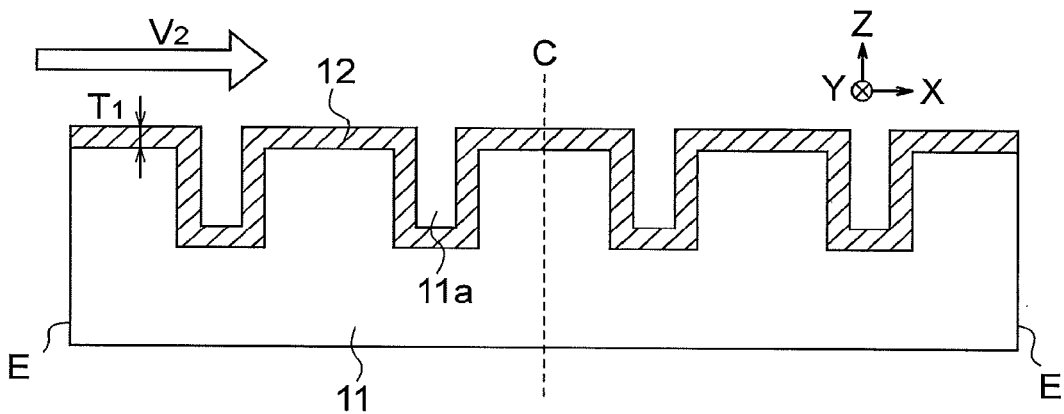
Figure 12C:
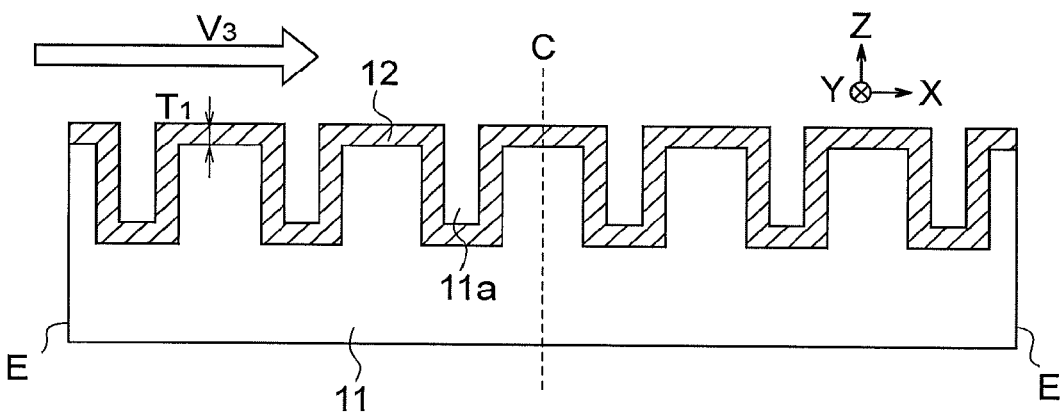

FIGS. 12A to 12C are sectional views illustrating the semiconductor manufacturing method of the first embodiment.

Wafers 11 of FIGS. 12A to 12C have a small surface area, a large surface area, and a larger surface area, respectively, similar to the wafers 11 of FIGS. 9A to 9C. In the present embodiment, the film 12 is formed on the surface of each wafer 11 of FIGS. 12A to 12C by the semiconductor manufacturing apparatus of any one of FIGS. 1 to 4. However, average flow velocities of the first gas of FIGS. 12A to 12C are set to flow velocities $V_1$, $V_2$ and $V_3$, respectively ($V_1<V_2<V_3$).

In this case, the thickness of the film 12 of FIG. 12A is uniform. When the film 12 is formed on the wafer 11 of FIG. 12B, instead of the wafer 11 of FIG. 12A, the average flow velocity of the first gas is increased from the flow velocity $V_1$ to the flow velocity $V_2$. Thereby, the film 12 having superior uniformity of the thickness can be formed in FIG. 12B. When the film 12 is formed on the wafer 11 of FIG. 12C, the average flow velocity of the first gas is increased to the flow velocity $V_3$. Thereby, the film 12 having superior uniformity of the thickness can be formed in FIG. 12C.

The flow velocity $V_1$ can be realized by using the first injector 3 of FIG. 3 or FIG. 4, for example. The flow velocity $V_2$ can be realized by using the second injector 4 of FIG. 3 or FIG. 4, for example. The flow velocity $V_3$ can be realized by using the third injector 7 of FIG. 3 or FIG. 4, for example. However, the flow velocities $V_1$, $V_2$ and $V_3$ can be realized by a method of FIGS. 13A and 13B.

FIGS. 13A and 13B are graphs illustrating an example of gas supply timing in the semiconductor manufacturing method of the first embodiment.

FIG. 13A illustrates supply timings of the first and second gases when the film 12 is formed on the wafer 11 having the small surface area. FIG. 13B illustrates supply timings of the first and second gases when the film 12 is formed on the wafer 11 having the large surface area. A symbol $G_A$ shows the supply timing of the first gas. A symbol $G_B$ shows the supply timing of the second gas. As illustrated in FIGS. 13A and 13B, the first gas and the second gas are alternately supplied repetitively. However, the first gas is supplied twice whenever the second gas is supplied once.

In the semiconductor manufacturing method, the supply amount of the second gas per one time takes a constant value $P_B$. Meanwhile, the supply amount of the first gas per one time takes a first value $P_{A1}$, a second value $P_{A2}$, and a third value $P_{A3}$. The first value $P_{A1}$ is a supply amount when the first gas is emitted from the first injector 3. The second value $P_{A2}$ is a supply amount when the first gas is emitted from the second injector 4. The third value $P_{A3}$ is a supply amount when the first gas is emitted from the third injector 7.

As illustrated in FIG. 13A, when the film 12 is formed on the wafer 11 having the small surface area, the first gas is supplied sequentially from the first and second injectors 3 and 4. Thereby, the average flow velocity of the first gas becomes the flow velocity $V_1$. As illustrated in FIG. 13B, when the film 12 is formed on the wafer 11 having the large surface area, the first gas is supplied sequentially from the second and third injectors 4 and 7. Thereby, the average flow velocity of the first gas becomes the flow velocity $V_2$. A process for supplying the first gas sequentially can be realized by using the gas feeder of FIG. 5 or 6.

In FIGS. 13A and 13B, the average flow velocity of the first gas is changed in two steps. However, the average flow velocity of the first gas may be changed in three or more steps. For example, the change of the flow velocity of the three or more steps may be realized by setting the number of injectors emitting the first gas to four or more. The change of the flow velocity of the three or more steps may be realized by adopting a process using the three injectors 3, 4 and 7 or a process using one of the injectors 3, 4 and 7, in addition to a process using two of the injectors 3, 4 and 7. In addition, the change of the flow velocity of the three steps or more may be realized by a method of FIG. 14.

Figure 14:
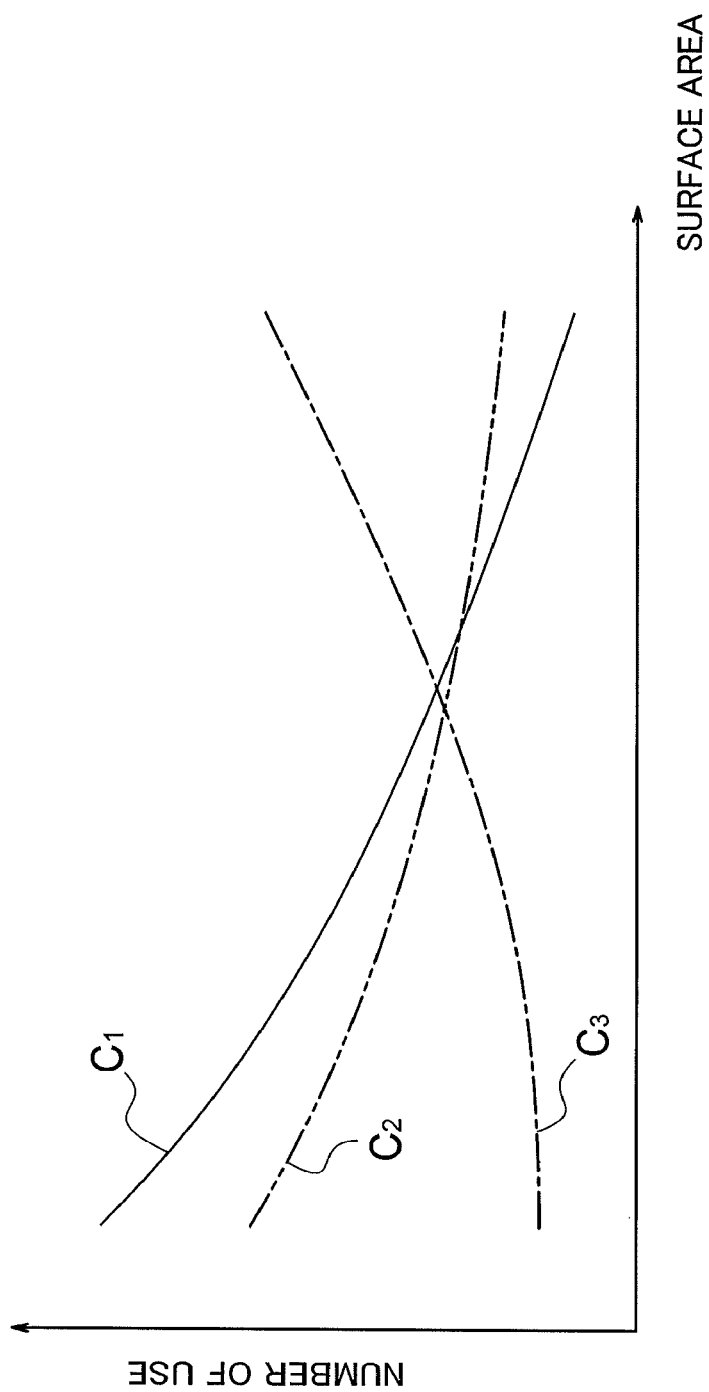
FIG. 14 is a graph illustrating an example of using injectors of the first embodiment.

FIG. 14 is a graph illustrating an example of using the injectors of the first embodiment.

In FIG. 14, the numbers of using the first to third injectors 3, 4 and 7 per unit time are changed according to the surface area of the wafer 11. Curved lines $C_1$ to $C_3$ show the numbers of using the first to third injectors 3, 4 and 7, respectively.

In FIG. 14, the number of using the first injector 3 decreases according to an increase in the surface area. Also, the number of using the second injector 4 moderately decreases according to the increase in the surface area. Furthermore, the number of using the third injector 7 increases according to the increase in the surface area. Thereby, the average flow velocity of the first gas can be increased according to the increase in the surface area of the wafer 11.

As described above, the semiconductor manufacturing apparatus of the present embodiment includes the first injector 3 having the first openings 3a and the second injector 4 having the second openings 4a whose number or size is different from the number or size of the first openings 3a. In addition, in the present embodiment, the first gas is emitted from the first openings 3a at the first flow velocity and the first gas is emitted from the second openings 4a at the second flow velocity different from the first flow velocity. Therefore, according to the present embodiment, the films 12 having the superior in-plane uniformity of the thicknesses can be formed on the wafers 11 having the various surface areas.

(Second Embodiment)

Figure 15A:
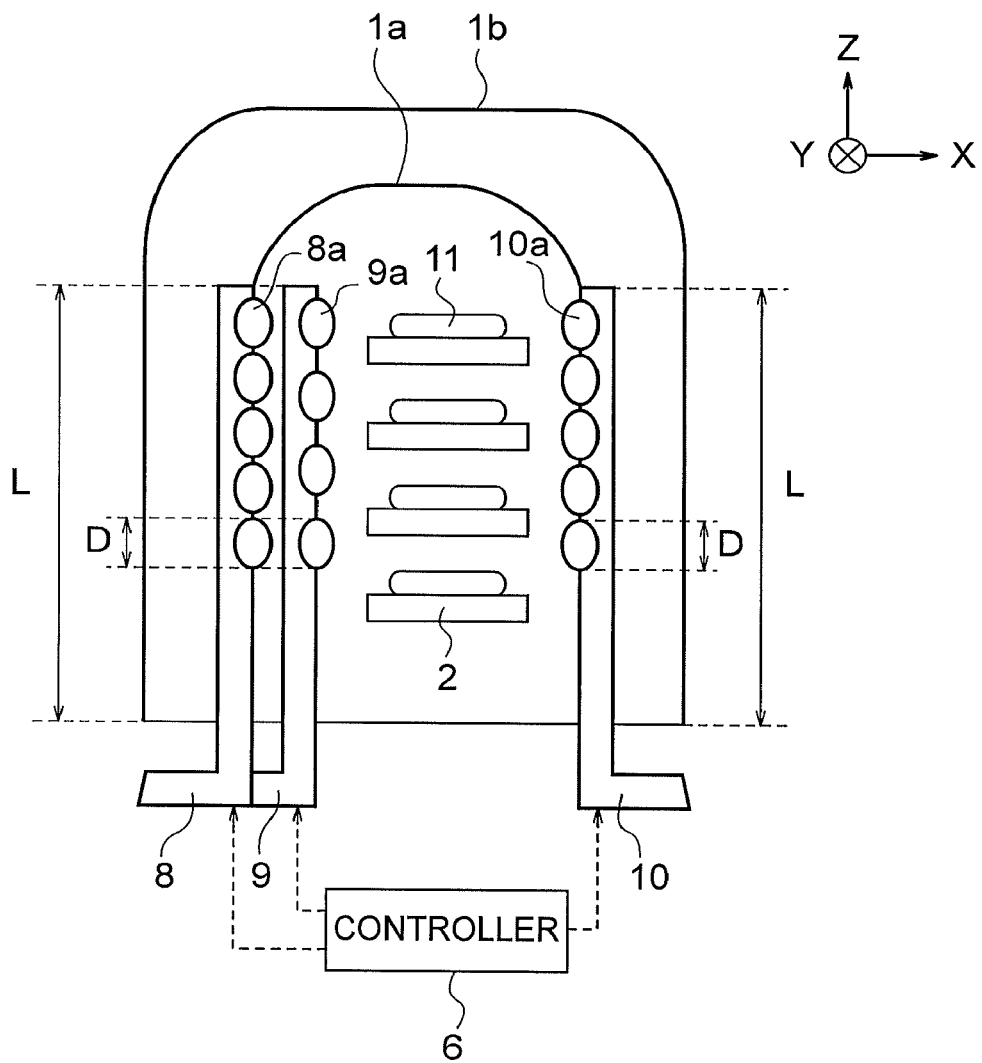
FIGS. 15A and 15B are sectional views illustrating a structure of a semiconductor manufacturing apparatus of a second embodiment.
Figure 15B:
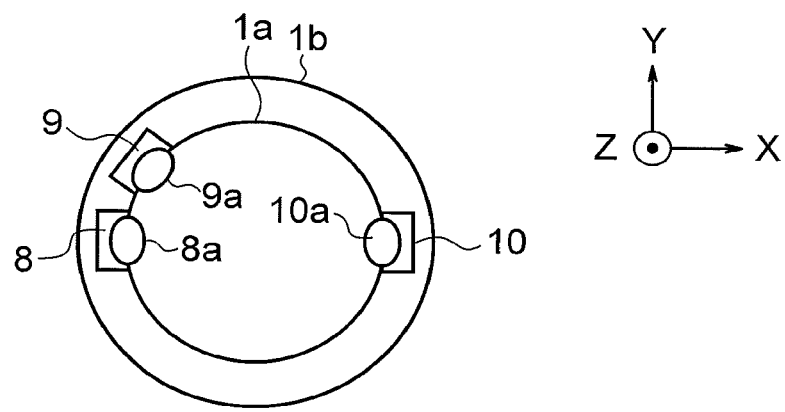

FIGS. 15A and 15B are sectional views illustrating a structure of a semiconductor manufacturing apparatus of a second embodiment.

FIG. 15A illustrates a vertical cross-section of the semiconductor manufacturing apparatus. FIG. 15B illustrates a horizontal cross-section of the semiconductor manufacturing apparatus. The semiconductor manufacturing apparatus of the present embodiment is a batch-type ALD apparatus that simultaneously forms films 12 on plural wafers 11, similar to the semiconductor manufacturing apparatus of FIGS. 1 to 4.

The semiconductor manufacturing apparatus of the present embodiment includes an internal glass tube 1a and an external glass tube 1b, instead of the glass tube 1. The internal glass tube 1a is an example of an internal accommodation module configuring an accommodation module. The external glass tube 1b is an example of an external accommodation module configuring the accommodation module.

The semiconductor manufacturing apparatus of the present embodiment further includes a first duct 8 as an example of a first flow channel, a second duct 9 as an example of a second flow channel, and a duct 10 as an example of a flow channel, instead of the injectors 3 to 5.

The internal glass tube 1a can accommodate the plural wafers 11. The external glass tube 1b surrounds the internal glass tube 1a. The wafer arrangement modules 2 are used to arrange the wafers 11 accommodated in the internal glass tube 1a. The semiconductor manufacturing apparatus of the present embodiment can rotate the wafers 11 arranged on the wafer arrangement modules 2 about an axis parallel to a Z direction.

The first duct 8, the second duct 9 and the duct 10 are arranged between the internal glass tube 1a and the external glass tube 1b and are arranged on an exterior wall surface of the internal glass tube 1a. The ducts 8 to 10 emit the source gas to form the films 12 on the wafers 11. The semiconductor manufacturing apparatus of the present embodiment is used to form silicon nitride films (SiN) on the wafers 11. The first and second ducts 8 and 9 emit a $SiH_2Cl_2$ gas as the source gas of silicon to the internal glass tube 1a. The duct 10 emits a $NH_3$ gas as the source gas of nitrogen into the internal glass tube 1a.

A symbol L shows the length of the first duct 8, the second duct 9 and the duct 10 between the internal glass tube 1a and the external glass tube 1b. In this manner, the ducts 8 to 10 have the same length L between the internal and external glass tubes 1a and 1b. The ducts 8 to 10 extend in the Z direction between the internal and external glass tubes 1a and 1b.

The first duct 8 has first openings 8a to emit the first gas ($SiH_2Cl_2$ gas) into the internal glass tube 1a, and the second duct 9 has second openings 9a to emit the first gas ($SiH_2Cl_2$ gas) into the internal glass tube 1a. A symbol D shows the diameter of the first and second openings 8a and 9a. In this manner, the first and second openings 8a and 9a have the same diameter D and therefore have the same size. However, the number of first openings 8a of the first duct 8 is five whereas the number of second openings 9a of the second duct 9 is four, so that these numbers are different from each other.

The duct 10 has openings 10a to emit the second gas ($NH_3$ gas) into the internal glass tube 1a. The openings 10a have the same diameter (size) as the diameter of the first and second openings 8a and 9a. However, the openings 10a may have a diameter (size) different from the diameter of the first and second openings 8a and 9a. In addition, the number of openings 10a of the duct 10 of the present embodiment is five. However, the number may not be five.

The controller 6 controls various operations of the semiconductor manufacturing apparatus. For example, the controller 6 controls supplying of the first gas to the first and second ducts 8 and 9 and supplying of the second gas to the duct 10. The controller 6 of the present embodiment can control supplying of the first and second gases by controlling an operation of an apparatus that supplies a gas to the ducts 8 to 10 and opening/closing of valves on flow channels that supply the gas to the ducts 8 to 10.

An opening area of the first duct 8 is represented by a total sum of areas of the first openings 8a provided on the first duct 8. A first flow velocity of the first gas emitted from the first openings 8a depends on the opening area of the first duct 8. Similarly, an opening area of the second duct 9 is represented by a total sum of areas of the second openings 9a provided on the second duct 9. A second flow velocity of the first gas emitted from the second opening 9a depends on the opening area of the second duct 9.

In the present embodiment, because the number of first openings 8a and the number of second openings 9a are different from each other, the opening area of the first duct 8 and the opening area of the second duct 9 are different from each other. Therefore, the controller 6 of the present embodiment can set the first flow velocity and the second flow velocity to different values easily. For example, the controller 6 can set the second flow velocity to a value more than the first flow velocity by supplying the first gas to the first and second ducts 8 and 9 at the same flow rate. Therefore, according to the present embodiment, similar to the first embodiment, the films 12 having superior in-plane uniformity of the thicknesses can be formed on the wafers 11 having the various surface areas.

Figure 16A:
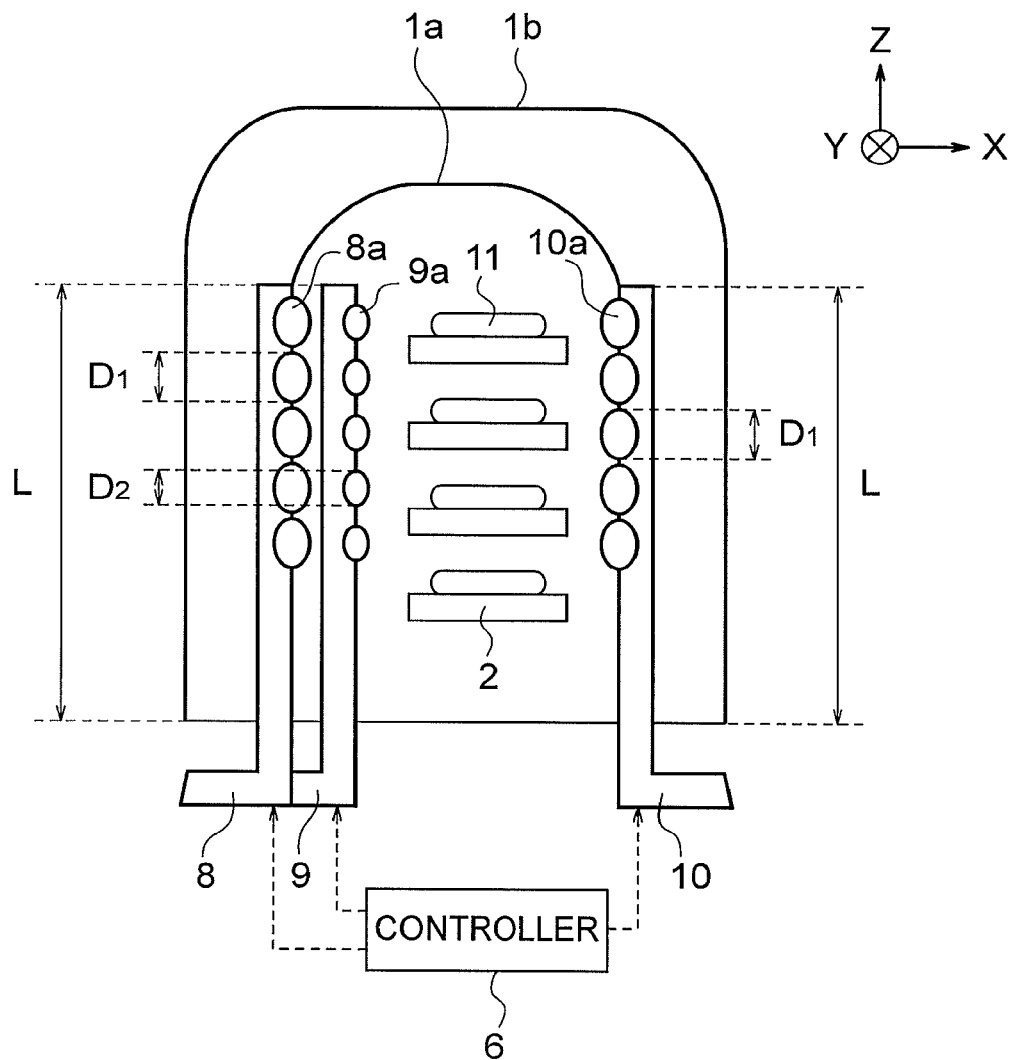
FIGS. 16A and 16B are sectional views illustrating a structure of a semiconductor manufacturing apparatus of a modification of the second embodiment.
Figure 16B:
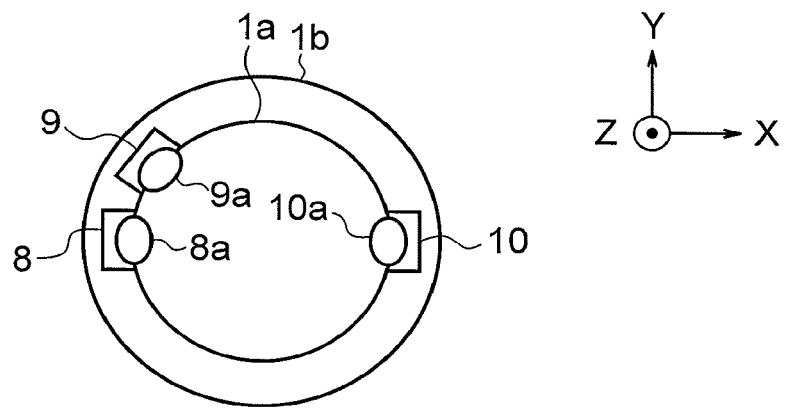

FIGS. 16A and 16B are sectional views illustrating a structure of a semiconductor manufacturing apparatus of a modification of the second embodiment.

In this modification, the number of second openings 9a of the second duct 9 is equal to the number of first openings 8a of the first duct 8. However, the diameter $D_2$ of the second openings 9a is smaller than the diameter $D_1$ of the first openings 8a and therefore the size of the second openings 9a is smaller than the size of the first openings 8a. For this reason, the opening area of the first duct 8 and the opening area of the second duct 9 in this modification are different from each other. Therefore, the flow velocity control by the controller 6 of FIG. 15 can also be realized in this modification.

The structure of FIGS. 3 and 4 is applicable to the present embodiment by replacing the injectors with the ducts. Similarly, the content described in FIGS. 5A to 14 is applicable to the present embodiment by replacing the injectors with the ducts.

As described above, the semiconductor manufacturing apparatus of the present embodiment includes the first duct 8 having the first openings 8a and the second duct 9 having the second openings 9a whose number or size is different from the number or size of the first openings 8a. In addition, in the present embodiment, the first gas is emitted from the first openings 8a at the first flow velocity, and the first gas is emitted from the second openings 9a at the second flow velocity different from the first flow velocity. Therefore, according to the present embodiment, the films 12 having superior in-plane uniformity of the thicknesses can be formed on the wafers 11 having the various surface areas.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   an accommodation module configured to accommodate a substrate,
   a first flow channel including first openings configured to emit a first gas into the accommodation module;
   a second flow channel including second openings configured to emit the first gas into the accommodation module, a number or a size of the second openings being different from a number or a size of the first openings;
   a third flow channel including third openings configured to emit the first gas into the accommodation module, a number or a size of the third openings being different from the number or the size of the first openings and the number or the size of the second openings; and
   a controller configured to control supplying of the first gas to the first, second and third flow channels such that the first gas is emitted from the first openings at a first flow velocity, the first gas is emitted from the second openings at a second flow velocity different from the first flow velocity, and the first gas is emitted from the third openings at a third flow velocity different from the first and second flow velocities.

2. The apparatus of claim 1, wherein
   the controller supplies the first gas from the first and second openings into the accommodation module when a surface area of the substrate has a first value, and
   the controller supplies the first gas from the second and third openings into the accommodation module when the surface area of the substrate has a second value different from the first value.

3. The apparatus of claim 1, wherein the first gas is a source gas to form a film on the substrate.

4. The apparatus of claim 1, further comprising a flow channel configured to emit a second gas different from the first gas into the accommodation module.

5. The apparatus of claim 4, wherein the first and second gases are source gases to form a film on the substrate by a reaction of the first and second gases.

6. The apparatus of claim 1, wherein the first and second flow channels have the same length in the accommodation module or between an internal accommodation module and an external accommodation module that configure the accommodation module.

7. The apparatus of claim 1, further comprising:
   a storage module configured to store the first gas, and
   an adjustment module configured to adjust a ratio of an amount of the first gas discharged from the storage module to the accommodation module and an amount of the first gas left in the storage module.

8. The apparatus of claim 7, wherein
   the controller uses the adjustment module to discharge the first gas of a first amount from the storage module and leave the first gas of a second amount in the storage module to supply the first gas of the first amount to the first flow channel, and
   the controller uses the adjustment module to discharge the first gas of the second amount left in the storage module to supply the first gas of the second amount to the second flow channel.

9. The apparatus of claim 1, further comprising:
   first to N-th storage modules configured to store the first gas where N is an integer of two or more; and
   first to N-th valves respectively provided on flow channels between the first to N-th storage modules and the accommodation module.

10. The apparatus of claim 9, wherein
    the controller uses the first to N-th valves to discharge the first gas from K storage modules among the first to N-th storage modules where K is an integer satisfying 0<K<N and leave the first gas in (N−K) storage modules among the first to N-th storage modules to supply the first gas from the K storage modules to the first flow channel, and the controller uses the first to N-th valves to discharge the first gas left in the (N−K) storage modules to supply the first gas from the (N−K) storage modules to the second flow channel.

11. A semiconductor manufacturing apparatus comprising:
   an accommodation module configured to accommodate a substrate;
   a first flow channel including first openings configured to emit a first gas into the accommodation module;
   a second flow channel including second openings configured to emit the first gas into the accommodation module, a number or a size of the second openings being different from a number or a size of the first openings;
   a third flow channel including third openings configured to emit the first gas into the accommodation module, a number or a size of the third openings being different from the number or the size of the first openings and the number or the size of the second openings; and
   a flow channel configured to emit a second gas different from the first gas into the accommodation module.

12. A semiconductor manufacturing method comprising:
   accommodating a substrate in an accommodation module;
   emitting a first gas from first openings of a first flow channel into the accommodation module at a first flow velocity;
   emitting the first gas from second openings of a second flow channel into the accommodation module at a second flow velocity different from the first flow velocity, a number or a size of the second openings being different from a number or a size of the first openings, and
   emitting the first gas from third openings of a third flow channel into the accommodation module at a third flow velocity different from the first and second flow velocities, a number or a size of the third openings being different from the number or the size of the first openings and the number or the size of the second openings.

13. The method of claim 12, wherein the first gas is a source gas to form a film on the substrate.

14. The method of claim 12, further comprising emitting a second gas different from the first gas into the accommodation module.

15. The method of claim 14, wherein the first and second gases are source gases to form a film on the substrate by a reaction of the first and second gases.

16. The method of claim 12, wherein the first, second and third flow channels have the same length in the accommodation module or between an internal accommodation module and an external accommodation module that configure the accommodation module.

17. The method of claim 12, further comprising:
   storing the first gas in a storage module; and
   using an adjustment module to adjust a ratio of an amount of the first gas discharged from the storage module to the accommodation module and an amount of the first gas left in the storage module.

18. The method of claim 12, further comprising:
   storing the first gas in first to N-th storage modules where N is an integer of 2 or more; and
   using first to N-th valves respectively provided on flow channels between the first to N-th storage modules and the accommodation module to discharge the first gas from one or more storage modules among the first to N-th storage modules to the accommodation module and leave the first gas in the other of the first to N-th storage modules.

* * * * *